United States Patent [19]

Schlesinger et al.

[11] Patent Number: 5,298,464

[45] Date of Patent: Mar. 29, 1994

[54] METHOD OF MOUNTING A TAPE AUTOMATED BONDED SEMICONDUCTOR IN A HOUSING USING A COMPRESSOR

[75] Inventors: Randall L. Schlesinger, Oakham; Ralph W. Doe; Richard D. Gates, both of Auburn; Dennis P. Goddard, Athol; Shih C. Hsu, Weston, all of Mass.

[73] Assignee: Digital Equipment Corporation, Maynard, Mass.

[21] Appl. No.: 890,984

[22] Filed: May 29, 1992

Related U.S. Application Data

[62] Division of Ser. No. 427,413, Oct. 26, 1989, Pat. No. 5,156,983.

[51] Int. Cl.⁵ .................... H01L 21/52; H01L 21/58; H01L 21/603
[52] U.S. Cl. ..................................... 437/216; 437/222
[58] Field of Search ............... 437/213, 216, 217, 222, 437/925, 215; 29/25.01, 740, 741; 269/903

[56] References Cited

U.S. PATENT DOCUMENTS

| | | | |
|---|---|---|---|
| 4,099,200 | 7/1978 | Koutalides | 257/735 |
| 4,672,418 | 6/1987 | Moran et al. | 257/703 |
| 4,769,345 | 9/1988 | Butt et al. | 437/217 |

FOREIGN PATENT DOCUMENTS

| | | | |
|---|---|---|---|
| 53-86575 | 7/1978 | Japan | 437/217 |
| 56-48155 | 5/1981 | Japan | 437/217 |
| 2164794 | 3/1986 | United Kingdom | 437/216 |

*Primary Examiner*—Olik Chaudhuri
*Assistant Examiner*—David E. Graybill
*Attorney, Agent, or Firm*—Cesari and McKenna

[57] ABSTRACT

This invention resides in a curing process for adhesive on a housing member of a tape automated bonding section (TAB section). A force is applied to the housing member and then the entire TAB section is heated to a sufficient temperature and for a sufficient duration to cure the adhesive. The applied force, coupled with the heat squeezes a portion of the adhesive out from between the TAB section and the housing member and onto an inner portion of the outer leads before the adhesive cures. This embeds the inner portion of the outer leads with adhesive so that they are retained in alignment with and electrically isolated from each other.

The manner in which the force is applied to the housing member during the curing process is also a novel feature of the invention. The TAB section within the carrier frame is placed on a pedestal in a mounting fixture. A compressor block is then disposed against the TAB section. A compressor bar clamped over the compressor block and to the mounting fixture urges the compressor block against the TAB section. This also causes a centrally-located spring loaded plunger within the compressor block to push against the semiconductor chip but with a reduced force. This reduced force presses the chip against a housing member aperture so that a silver epoxy mounted in the aperture can evenly disperse over the semiconductor chip.

9 Claims, 6 Drawing Sheets

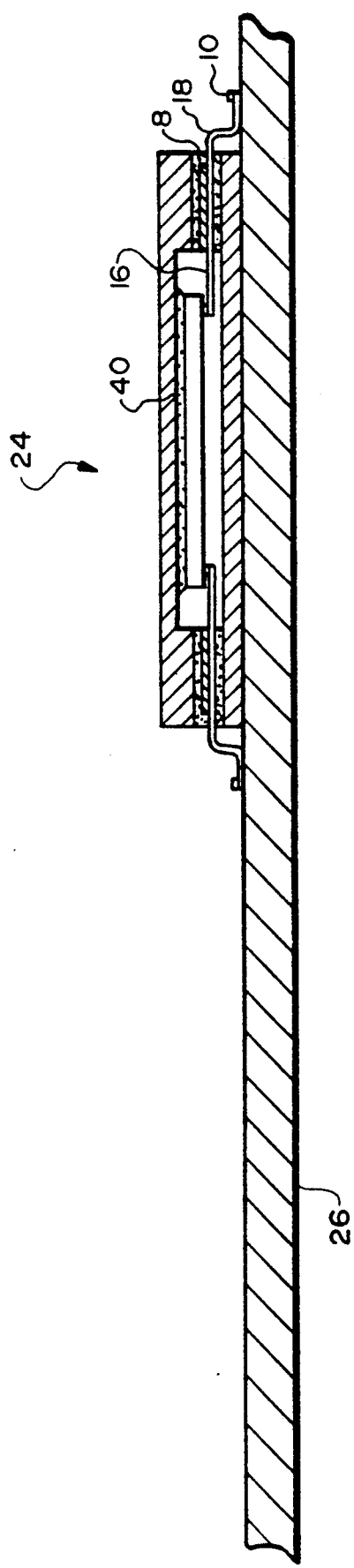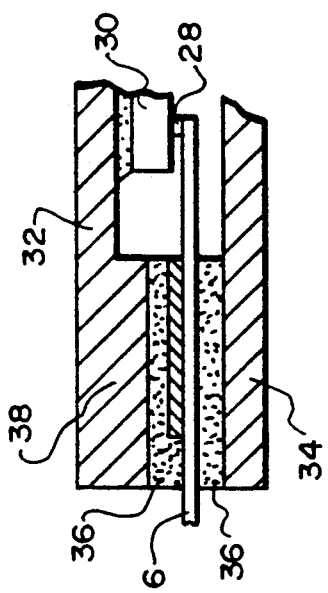

5,298,464

METHOD OF MOUNTING A TAPE AUTOMATED BONDED SEMICONDUCTOR IN A HOUSING USING A COMPRESSOR

RELATED APPLICATION

This application is a divisional of copending application Ser. No. 07/427,413, filed on Oct. 26, 1989 now U.S. Pat. No. 5,156,983.

FIELD OF THE INVENTION

This invention relates generally to the field of packaging for integrated circuit chips and more particularly to a method of manufacturing tape automated bonding packages

BACKGROUND OF THE INVENTION

Packaging is one of the final steps in the process of manufacturing integrated semiconductor circuit components or chips. In packaging, a fabricated semiconductor chip is mounted in a protective housing. After packaging, the assembled component is subjected to final testing and ultimately then connected into an electronic circuit.

Currently, many semiconductor chips are contained in plastic packages. These packages are provided with reinforced metal leads for electrically connecting the chip to the printed circuit board which contains the circuit in which the chip is to be included. Within the package, one end of each lead is connected to a specific bonding point on the chip, usually by an intermediate lead. The other end of the lead, which extends outside of the package, is attached to a connection on the printing circuit board.

Advances in semiconductor manufacturing technology have made the fabrication of Very Large Scale Integration (VLSI) chips possible. A VLSI chip comprises a large number of individual circuit components that are fabricated together on a single, small chip. VLSI chips are able to perform a large number of electrical functions, and perform them more rapidly, than was previously possible.

To date, it has been difficult to provide suitable packaging for VLSI chips. In part, this is because each chip requires a large number of connections to external circuit elements. Many VLSI chips have over 300 bonding points, each of which must be connected to a lead for connection to external circuit elements.

Another consideration in the use of a VLSI chip is the need to provide common voltages to a number of different locations on the chip. For instance, in a chip that comprises a number of individual C-MOS transistors, such a chip may require a common drain voltage and a common source voltage for the transistor provided by an external power supply. Typically, the drain voltage is positive with respect to a common reference or ground voltage and the source voltage is typically at the same level as the ground voltage.

Normally, common voltages are supplied to the components on the chip by providing sets of leads. Each set of leads carries the same voltage to different bond points on the chip. To date, providing a VLSI chip with a common voltage at a number of locations has been a difficult task. In a VLSI package, the leads which are connected to the chip are spaced closely together. Moreover, some of the leads supply signal voltages that fluctuate rapidly as electronic functions are performed by the chip and the other circuit components This causes the magnetic fields normally developed around these leads to vary which in turn causes inductive currents to flow in adjacent leads. Whenever a sufficiently large inductive current is developed in a common voltage lead, the voltage on the lead changes. This problem may be intensified because in a VLSI chip voltages may fluctuate rapidly. This rapid change also intensifies the development of a magnetic field and the associated inductive current flow. As a result, the voltage supplied to one or more components on the VLSI chip may vary so greatly as to cause the chip to malfunction.

There are prior VLSI chip packages that are designed to minimize the problems associated with the development of inductive current flow. One such package is a multi-layered ceramic package. This package includes layers of conductors separated by layers of dielectric ceramic. A cavity is formed in the ceramic layers and the chip is mounted in the cavity. Wire bonds connect the bond points on the chip to the individual conductors on the top layer of conductors. Individual wire bonds or reinforced metal leads provide an electrical connection to the printed circuit board to which the chip is attached. Selected top-layer conductors, which carry common voltages, are connected to common intermediate-layer conductors. The intermediate-layer conductors function as reference voltage planes which insure that the common voltages supplied through the top-layer conductors attached thereto does not appreciably vary.

However, there are a number of limitations associated with multi-layer ceramic packages. The size of these packages tends to be overly large in order to accommodate the interconnections needed between the conductor layers. Moreover, a ceramic package designed to contain a VLSI chip is expensive to manufacture. In some instances, the cost of the multi-layered ceramic package may significantly exceed the cost of fabricating the chip.

There have also been some attempts at providing packages for semiconductor chips wherein a single lead, bonded to the package, extends out from the package and has an outer lead portion that is used for subsequent bonding to a printed circuit conductor or other circuit elements. These packages have been formed from leads that extend from a section of metal tape. They can be used to provide only a relatively limited number of leads and thus do not provide the number of required interconnections needed for VLSI chips and the like. Moreover, to prevent environmental exposure of the packaged chip, which may cause the chip's degradation and malfunction, the package is often filled with an encapsulation material so as to entirely cover the chip and the leads thereto. The encapsulation is a difficult and time consuming process that adds to the overall expense of packaging the chip. Furthermore, there are some difficulties associated with removing the encapsulating material in order to access the packaged chip.

SUMMARY OF THE INVENTION

This invention makes use of a process known as tape automated bonding (TAB). TAB consists of using a tape section with electrical leads therein to electrically connect a semiconductor chip to a pad on a printed wire board. Typically, a tape automated bonding section (TAB section) consists of a central aperture for receiving a semiconductor chip and a plurality of electrical conductors extending from the outer perimeter of the central aperture to a plurality of test pads on the outer perimeter of the TAB section. Specifically, each electrical conductor within the TAB section has an inner lead located around the perimeter of the central aperture, an outer lead distally located from the inner lead, and a test pad located on the outer perimeter of the TAB section. After the semiconductor chip has been mounted into the central aperture, the chip and the inner leads are encapsulated within a housing member.

In brief summary, the manufacture of a TAB section with a semiconductor package involves the mounting of an individual TAB section within a carrier frame. A semiconductor chip is arranged within the central aperture so that each contact pad on the semiconductor chip is aligned with and then bonded to a specific inner lead in the TAB section. A housing member mounted on opposite faces of the TAB section encloses the semiconductor chip and the inner leads therebetween. Next, a nickel material and then a solder coat is applied to the outer leads. The solder coat on the outer leads ensures a good solder joint between the outer lead and a pad on a printed wire board while the nickel provides a barrier between the solder coat and the gold plated copper wire, since it is commonly known that the intermixing of gold and solder produces a tin that has poor electrical conductivity and low shearing strength. Finally, the entire TAB section is tested and then excised from the frame.

This invention involves the selective plating of the outer leads of the TAB section. As stated above, the TAB section has a plurality of test pads located around the outer perimeter of the TAB section. Each of these test pads is electrically connected to a "debus" area in the TAB section and each "debus" area is electrically connected to a common plane conductor. Initially, an inner and an outer gasket are mounted over, respectively, an inner and an outer portion of the outer leads and then a voltage is applied to the Common plane conductor. A barrier material, usually nickel, is applied to the outer leads protruding between the inner and the outer leads and then solder is applied over the nickel layer. Finally, the debus areas are excised from the TAB section and the TAB section is ready for final test, inspection, and excising.

Another feature of the invention involves the curing process for the adhesive on the housing member. A force is applied to a surface of the housing member that does not have adhesive on it and then the entire TAB section is heated to a sufficient temperature and for a sufficient duration to cure the adhesive. The applied force, coupled with the heat, squeezes a portion of the adhesive out from between the TAB section and the housing member and onto an inner portion of the outer leads before the adhesive cures. This embeds the inner portion of the outer leads with adhesive so that they are retained in alignment with and electrically isolated from each other.

The manner in which the force is applied to the housing member during the curing process is also a novel feature of the invention. When the force is applied to the housing member, the TAB section within the carrier frame is placed on a pedestal in a mounting fixture so that the housing member mounted lies within a housing member seating space within the pedestal. A compressor block is then disposed against the opposite surface of the TAB section. A compressor bar clamped over the compressor block and to the mounting fixture urges the compressor block against the TAB section. This also causes a centrally-located spring loaded plunger within the compressor block to push against the semiconductor chip but with a reduced force. This reduced force presses the chip against a housing member recess so that a silver epoxy mounted in the recess can evenly disperse over the semiconductor chip.

BRIEF DESCRIPTION OF THE DRAWINGS

FIG. 2a is a cross-section view of the tab semiconductor package of this invention attached to a printed wire board.

FIG. 2b is an enlarged view of a portion of FIG. 2a.

DETAILED DESCRIPTION OF ILLUSTRATIVE EMBODIMENT

Figure 1:
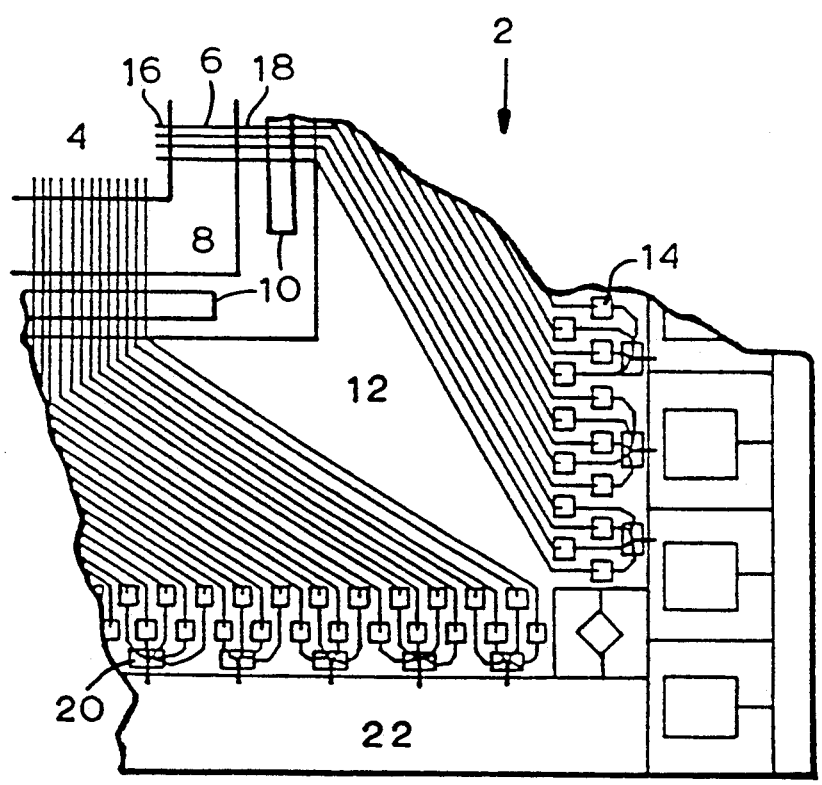
FIG. 1 is a top-view of a section of tape automated bonding section including the leads and the polyimide carrier underneath them, used in the manufacture of the tab semiconductor package of this invention.

FIG. 1 illustrates a tape automated bonding section 2 (TAB section) used in the manufacturing of a tape automated bonding (TAB) semiconductor package (not shown). The TAB section 2 has a central aperture 4 for receiving a semiconductor chip (not shown) and mounting it to the electrical conductors 6. The electrical conductors 6 extend from the perimeter of the central aperture 4, under a dielectric film 8, under a tie down bar 10, over a tape carrier portion 12, and terminates a test pad 14 located around the perimeter of the TAB section 2. Each electrical conductor 6 has inner lead 16 that extends into the central aperture 4 and an outer lead 18 that extends from the dielectric film layer 8 to the tape carrier portion 12. As will be explained later in this specification, a housing member will be mounted on the film layer 8 between the inner leads 16 and the outer leads 18 which will enclose the semiconductor chip (not shown) and the inner leads 16 therebetween. The TAB section 2 also has a plurality of debus areas 20 which connect a plurality of test pads 14 to a common plane conductor 22. The debus areas 20 is an open area with no dielectric film beneath the electrical conductor interconnects. The common plane conductor 22, as will be explained latter in this specification, has a voltage applied to it during the electroplating process.

Referring now to FIGS. 2a and 2b, it shows a completed TAB semiconductor package 24 constructed according to this invention. Outer leads 18 bond the TAB semiconductor package 24 to a plurality of contact pads (not shown) on the printed circuit board 26. Likewise, inner leads 16 bond the TAB section 2

(FIG. 1) to a plurality of contact pads 28 on a semiconductor chip 30. These inner and outer leads 16 and 18, respectively, are manufactured out of a gold-plated copper to insure good electrical conductivity. The tie down bar 10 over the outer portion of the outer leads 18 further helps maintain the outer leads 18 in registration with the contact pads on the board 26 during lead to contact pad bonding process.

A base 32 and a lid 34 together encapsulate the chip 30 while adhesive layers 36 secures the base 32 and the lid 34 to the TAB section. The base 32 and the lid 34 are manufactured out of an electrically insulating and thermally conductive material such as plastic or ceramic. The base 32 has a rim 38 around the outer perimeter thereof in which the semiconductor chip 30 is mounted. Together, the base 32, the lid 34, and the layers 36 protect the chip 30 and the inner leads 16 from exposure to environmental contaminants. In this respect, an inward spacing of the dielectric film 8, usually a polyimide film, from the outer edges of the rim 38 so that the adhesive layers 36 merge around the inner portion of the outer leads 18 also further enhances this protection. The layers 36 are non-conductive and resist decomposition or other breakdown through a wide range of temperatures which far exceed the normal operating temperature of the chip 8. A good material for such layers is an epoxy for example an epoxy amine such as "Ablestick 564" brand epoxy amine.

An adhesive layer 40 secures the chip 30 to the base 32. In the preferred embodiment of the invention, this layer is a thermally conductive adhesive, for example a silvered epoxy, that provides an efficient exhaust path for the heat generated by the chip 30. Moreover, when the adhesive layer 40 mounts the chip 30 to base 32, this allows a heat sink (not illustrated) to be mounted to the flat surface of the base 32 because the adhesive layer will efficiently transfer to the base the heat generated by the chip.

This package 24 provides numerous advantages. It provides complete mechanical protection for the chip 30 and for the inner leads 16. It also offers a convenient chip-to-TAB and tape-to-printed wiring board interconnect system with environmental and mechanical protection for the chip. Furthermore, since the TAB section can readily be provided with a large number of leads for interconnection, the package is especially suited for protecting VLSI and other chips that have a large number of interconnections.

Figure 3A:
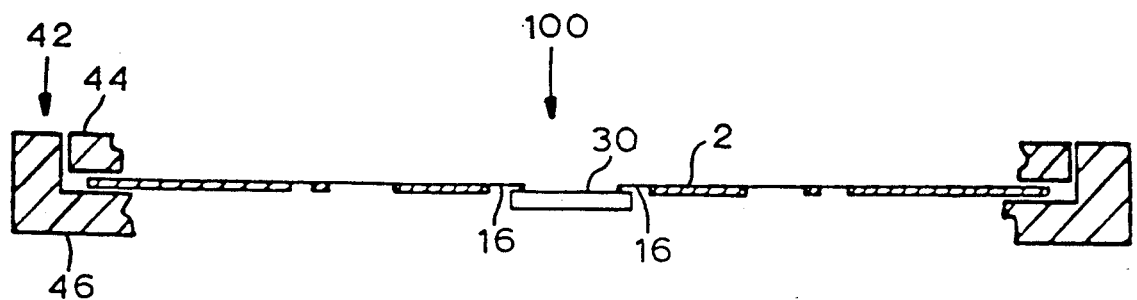
FIG. 3a is a cross-section view of a section of tape automated bonding section supported by a carrier.

FIGS. 3a through 3g illustrate the method of manufacturing the semiconductor package 24. As illustrated in FIG. 3a, the TAB section 2 of FIG. 1 is mounted in a carrier frame 42. This carrier frame 42 comprises an inner frame member 44 and an outer frame member 46 that clamp to the TAB section 2. This frame 42 prevents the warping of the TAB section 2 during the manufacturing process and also determines the pin locations of the electrical conductors within TAB section. Moreover, the frame 42 permits handling of the TAB section 2 without damaging the frail leads. Each contact pad (not shown) on the chip 30 is aligned with and then bonded to the corresponding correct inner leads 16 of the TAB section 2 using known bonding practices. A small amount of epoxy overcoat (not shown), typically to a thickness of about 0.003 inches, is then placed over the chip surface containing the chip circuitry and the chip bond points. This overcoat covers the entire surface of the chip, the chip-to-inner lead bonds, and the inner portion of the inner leads which are in registration with the surface of the chip. This overcoat serves as an environmental protection for both the chip 30, the chip-to-inner lead bonds, and the inner leads 16.

Figure 3C:
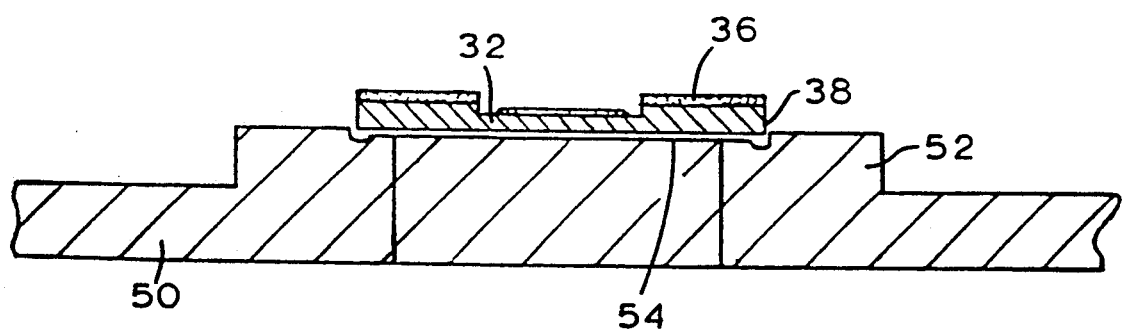
FIG. 3c is a cross-section view showing the base section of a package according to this invention, with adhesive thereon, held in a mounting fixture.
Figure 3B:
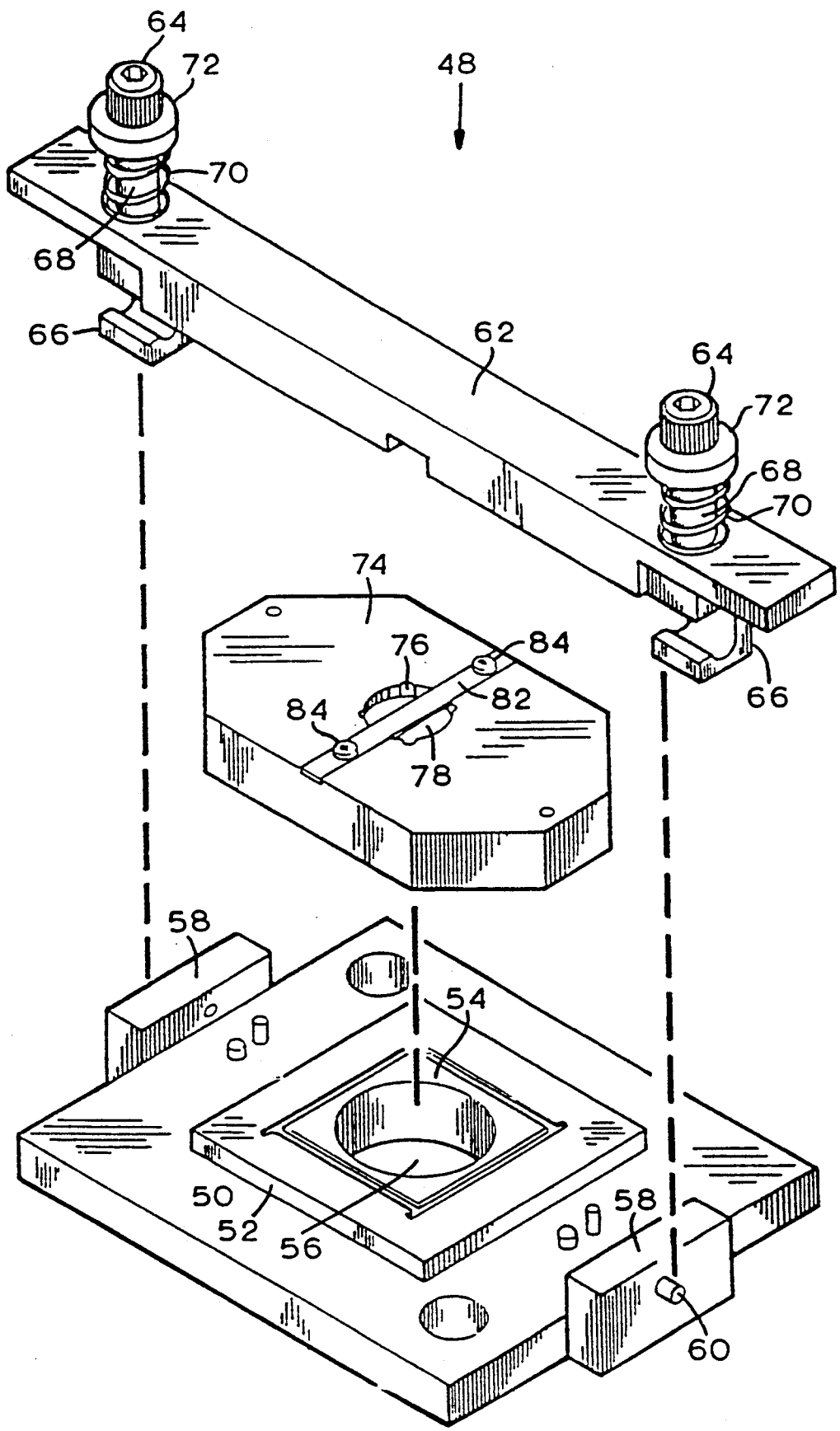
FIG. 3b is an exploded view of a die and film-to-package mounting assembly according to this invention.
Figure 3D:
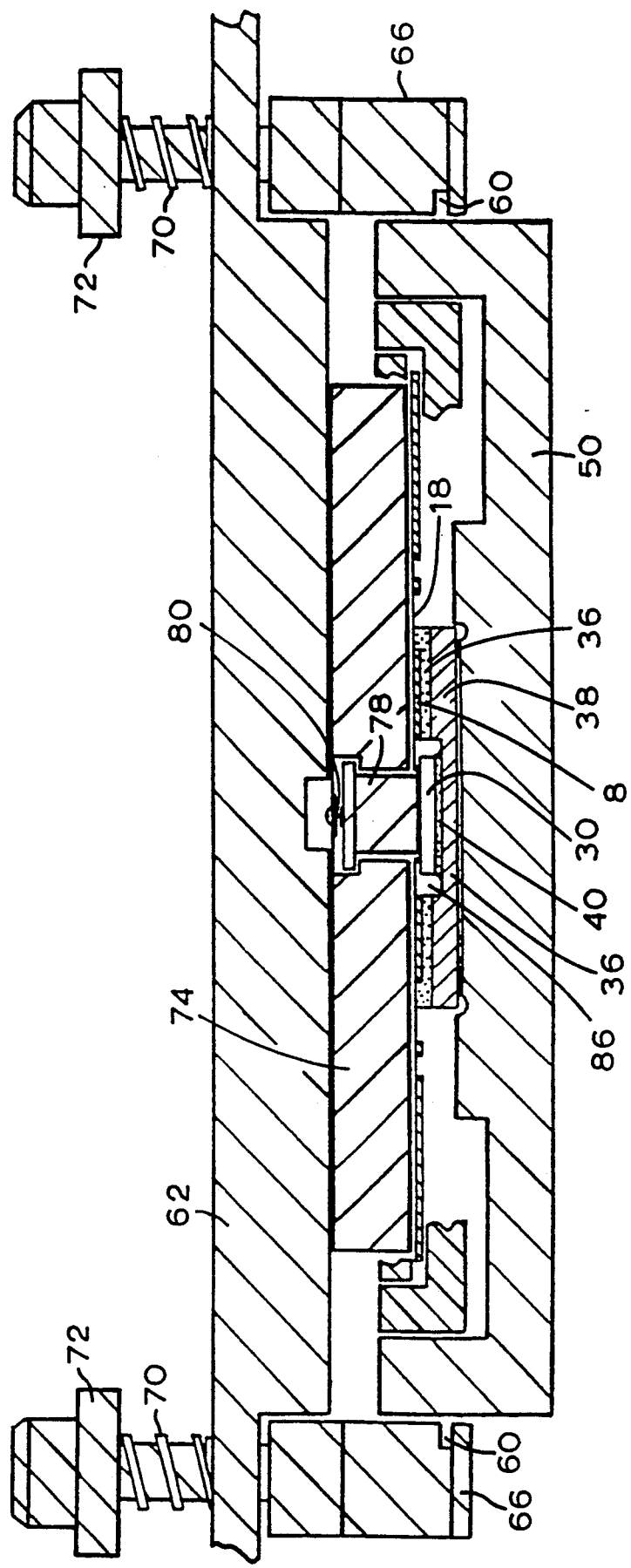
FIG. 3d is a cross-section view of the assembly of FIG. 3a being secured to the base assembly of FIG. 3c.

A compressor unit 48 in FIG. 3b mounts the base 32 and the lid 34 (shown in FIG. 2b) onto the chip-and-TAB section 100 (shown in FIG. 3a). This unit 48 disclosed in FIG. 3b, has a mounting fixture 50 upon which a pedestal 52 projects therefrom. The pedestal 52 contains a base seating space 54 in which the base 32, as explained below in describing FIG. 3d, is held during this assembly process. A hole 56 is located within the pedestal 52 for the removal of the chip-and-TAB section. Moreover, two mounting blocks 58 are mounted on two opposite sides of the fixture 50, each block 58 having an outwardly extending coupling pin 60 for the application of force onto the chip-and-TAB assembly 100 (FIG. 3a) by a compressor bar 62. The compressor bar 62 has on each side a clamping assembly 64 for securing the bar 62 to the mounting fixture 50. Each clamping assembly 64 includes a C-shaped clamp 66 dimensioned to receive the coupling pin 60 and attached to a pin 68 that extends through the compressor bar 62. Springs 70 between the bar 62 and collars 72 attach to the top of the pins and bias the clamps so that when the compressor bar 62 is coupled to the mounting fixture 50 it is urged against the pedestal 52.

A compressor block 74 lies directly under the compressor bar 62. The compressor block 74 has a central bore 76 in which a plunger 78 is disposed. A plunger spring 80, shown in FIG. 3d positioned between the top of the plunger 78 and a metal band 82 secured to the top of the compressor block 74 by screws 84, urges the plunger 78 against the semiconductor chip 30 as described below in the discussion of FIG. 3d. The compressor block 74 and the associated plunger 78 both being formed of "Teflon" brand material or another material that will not react with the adhesive layers 36 (FIG. 2b) during assembly or curing.

Referring now to FIG. 3c, the base 32 is mounted in the base seating space 54 in the pedestal 52 of the mounting fixture 50. The adhesive 36, in the form of a B-staged partially cured epoxy, is applied onto the rim 38 of the base 32.

Referring now to FIG. 3d, the chip-and-TAB section 100 (from FIG. 3a) is then mounted on the prepared base 32 between the inner leads and the outer leads and the remaining members of the compressor unit 48 (from FIG. 3b) are assembled over the mounting fixture 50. Specifically, the compressor block 74 is mounted over the chip-and-TAB section 100 (FIG. 3a) and the compressor bar 62 is mounted over the compressor block 74. The C-shaped clamps 66 grapple the coupling pins 60 on the mounting fixture 50 which in turn compresses the springs 70 between the compressor bar 62 and the collars 72. The springs 70 urge the compressor bar 62 downward with a force equalling the spring constant of the springs 70 and the distance the springs 70 are compressed. In turn, the compressor bar 62 urges the compressor block 74 against the chip-and-TAB section 100 (FIG. 3a) with a force that causes a fraction of the partially cured adhesive layers 36 between the dielectric film 8 and the base rim 38 to ooze out from and rise between and around the exposed portions of the outer leads 18 that are disposed around the outer perimeter of the base rim 38.

Inside the compressor block 74, plunger 78, independently downwardly biased by spring 80, urges the chip 30 against the thermally conductive adhesive layer 40 so as to ensure that the chip 30 is securely fastened inside a recess 86 within the base 32. To ensure that the epoxy in the adhesive layer 36 properly flows out between the dielectric film 8 and the base rim 38, it may be generally necessary to heat the subassembly.

Figure 3E:
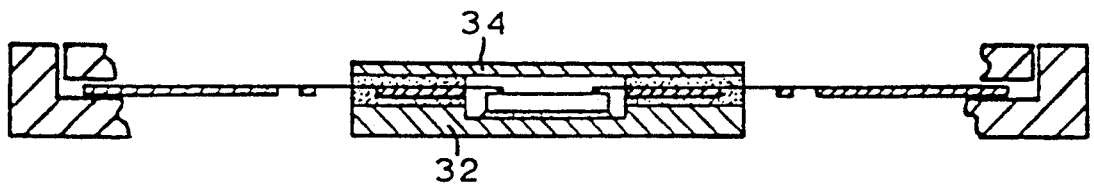
FIG. 3e is a cross-section view of a partial package assembly of FIG. 3d.

After the adhesive layer 36 on the base 32 has been properly cured, the subassembly is removed from the compressor unit 48 (FIG. 3b). The lid 34 (FIG. 2), which has been coated with adhesive, is then attached to the subassembly. The subassembly is then subject to a final cure with adhesive on the lid 34 forming a seal between the base 32 and the lid 34. With the particular epoxy described, during the final cure, the subassembly is heated to approximately 150° C. for approximately 2 hours. FIG. 3e shows the subassembly after the base 32 and the lid 34 have been mounted. It should be noted that the base 32 and the lid 34 are mounted onto the subassembly on the dielectric film that exists between the inner leads and the outer leads.

Figure 3F:
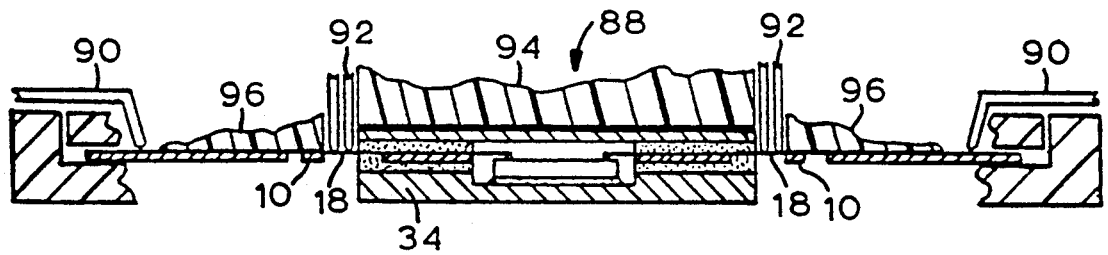
FIG. 3f is a cross-section view of a partial package assembly, as in FIG. 3e, showing the outer lead portions of the package receiving a coating so as to adapt same for soldering.
Figure 3G:
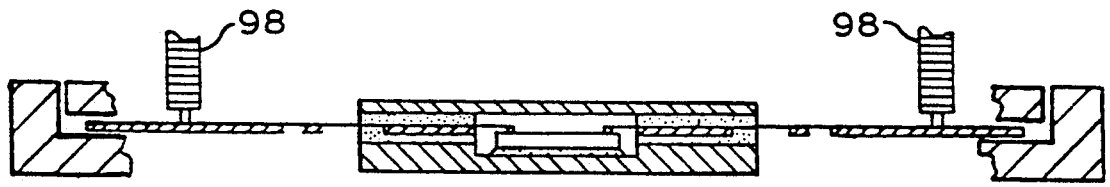
FIG. 3g is a cross-section view of a partial package assembly, as in FIG. 3f, showing the debus area around the perimeter of the film being removed.

In FIG. 3f, after the subassembly has been cured, the outer leads 18 are coated with a barrier material and a solder layer so that they can be readily solder bonded to their appropriate contact pads on a printed wiring board. An intermediate coating of nickel serves as a barrier to prevent the gold on the copper leads 18 from reacting with the solder while an outer coating of solder, typically a tin-lead alloy, serves as the solder for the outer lead bonding. Both coatings are applied with an electroplating device 88. The electroplating device 88 has a number of electrodes 90 that apply an electromotive potential to the common plane conductor 22 (FIG. 1) located around outer perimeter of the carrier portion 12 of the TAB section 2 (FIG. 1). The electroplating device 88 has a number of jets 92 adapted to apply first the barrier material solution and then a solder to the exposed outer leads 18. The electroplating device 88 also has an inner and outer gasket 94 and 96, respectively, that prevent the applied barrier and solder solutions from flowing over the lid 34 or beyond the portions of the leads that extend beyond the tie-down bars 10.

After plating has been completed and now referring once again to FIG. 1, the debus areas 20 are removed from the TAB section 2 so that the TAB section 2 is subject to final testing. A laser 98 (shown in FIG. 3g) selectively burns the debus areas 20 from the TAB section 2. Socket pins (not shown) are applied to test pads 14 located inside the outer perimeter of the TAB section 2 and then the assembled package is subject to final test. Finally, the tested package (not shown) is excised from the frame (42 in FIG. 3a) between the tie-down bars 10 and a polyimide carrier portion 12. The outer leads 18 are formed into a gull-wing or other profile suitable for making an interconnection.

Again referring to FIG. 1, the electroplating process of this method, described above, provides a convenient method of applying solder to the outer leads 18 of the TAB section 2 prior to outer lead bonding. This process also insures that only the outer leads 18, the only portions of the electrical conductors 6 that need to be coated with solder, are so coated. This process also prevents the gold plating on the test pads 14 from being coated with solder which can subsequently degrade the required electrode-to-test pad conductivity needed for proper extended burn-in testing of the packaged chip.

With the foregoing method of assembly, the electrical connections required by the package can be performed economically and rapidly by automated equipment. Also, the assembly process provides an economical way to apply solder to the outer leads 18 of the package so that those leads can be readily bonded to their associated printed circuit board contact pads. A further advantage of the process is that the TAB section 2 can be affixed to the frame 42 with essentially no warping of the TAB section. In other words, after assembly the TAB tape is essentially planar in the frame. With no warp or damage to the assembled package, it can be assembled flat on the printed wiring board. This also simplifies the attachment of a heat sink to the top of the TAB section 2, i.e., the base 32, since automated equipment can be used to make the attachment to an essentially warp-free package.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed is:

1. A method for manufacturing a semiconductor package comprising a semiconductor chip disposed within a housing including a base and a lid secured to said base, and a tape automated bonding (TAB) section mounted to a carrier frame, said TAB section having (i) a central aperture in which said semiconductor chip is disposed, (ii) a plurality of inner leads connected to a plurality of contact pads on said semiconductor chip, and (iii) a plurality of outer leads distally located from said inner leads, said TAB section and semiconductor chip forming a chip subassembly; said method comprising the steps of:
    A) using a compressor unit comprising a mounting fixture provided with a base seating space, a compressor block, and a compressor bar capable of being secured to said mounting fixture by a clamping assembly;
    B) mounting said base in said base mounting space
    C) applying a first adhesive to a portion of said base to form a prepared base;
    D) mounting said chip subassembly on said prepared base;
    E) mounting said compressor block over said chip subassembly;
    F) clamping said compressor block between said compressor bar and said mounting fixture;
    G) urging said compressor block against the chip subassembly with a force that causes a fraction of said first adhesive to flow out from between said TAB section and base and around an inner portion of said outer leads;
    H) removing said base and chip subassembly from said compressor unit;
    I) attaching said lid to said base using a second adhesive to form said semiconductor package; and
    J) heating said semiconductor package at a sufficient temperature and duration so as to cure said first and second adhesives, thereby embedding said inner portion of said outer leads in said first adhesive so as to maintain alignment and electrical isolation of said outer leads.

2. The method in accordance with claim 1, further comprising the steps of using a first biasing means for urging said compressor bar against said mounting fixture with a first force, and using a second biasing means for urging said compressor block against said chip subassembly with a second force that is less than said first force.

3. The method in accordance wih claim 2, wherein said second biasing means using step includes the step of biasing a plunger disposed within said compressor block to push said semiconductor chip against said first adhesive on said base when said first biasing means presses said compressor bar against said compressor block, whereby said adhesive is dispersed over said semiconductor chip.

4. In a process of manufacturing a tape automated bonding semiconductor package including a housing member mounted on a tape automated bonding section, the tape automated bonding section having (i) a central aperture in which a semiconductor chip is mounted, and (ii) a plurality of electrical conductors, each electrical conductor having an inner lead located around the perimeter of the central aperture and connected to a contact pad on the semiconductor chip, and an outer lead distally located from the inner lead, and wherein a first surface of the housing member has a centrally located recess for receiving the semiconductor chip and an adhesive along an outer perimeter thereof, the first surface of the housing member contacting the tape automated bonding section in a closed path between the inner leads and outer leads, the adhesive contacting the tape automated bonding section at the perimeter of the housing member, a method of applying a force to the tape automated bonding section comprising the steps of:
  a) mounting a carrier frame around the outer perimeter of the tape automated bonding section;
  b) mounting the tape automated bonding section into a pedestal in a mounting fixture so that a second surface of the housing member, opposite the first surface, is in registration with a housing member seating space within the pedestal and a first surface of the tape automated bonding section is in registration with the pedestal; and
  c) mounting a compressor block against a second surface of the tape automated bonding section, opposite the first surface, and against the semiconductor chip, and a compressor bar over the compressor block and to the mounting fixture so that the compressor bar both urges the compressor block against the tape automated bonding section with a first force and urges an independently biased force means within the compressor block against the semiconductor chip with a second force.

5. The method of claim 4 wherein the step of mounting the compressor block comprises urging the compressor block against the tape automated bonding section with a first force of approximately 8 pounds per square inch.

6. The method of claim 4 wherein the step of mounting the compressor block comprises urging the independently biased force means against the semiconductor chip with a second force of approximately 4.5 pounds per square inch.

7. The method of claim 6 wherein the sep of mounting a compressor block comprises mounting a compressor block manufactured of a material that will not react with nor stick to the adhesive.

8. In a process of manufacturing a tape automated bonding (TAB) semiconductor package having a housing mounted on a TAB section, said housing including a base and a lid securable to said base, said TAB section being mounted within a carrier frame and having a central aperture in which a semiconductor chip is mounted, a plurality of inner leads located at the perimeter of said central aperture and connected to a plurality of contact pads on said semiconductor chip, and a plurality of outer leads connected to said inner leads, and wherein a first surface of said housing has an adhesive along an outer perimeter thereof, said first surface contacting said TAB section between said inner leads and outer leads and at the perimeter of said housing, a method of curing said adhesive comprising the steps of:
  a) using a compressor unit to urge said housing against said TAB section along said first surface, said compressor unit comprising a mounting fixture provided with a base seating space for receiving said base of said housing, a compressor block, and a compressor bar secured to said mounting fixture by a clamping assembly, said compressor unit using step comprising the steps of
    i) using a first biasing means for pressing said compressor bar against said compressor block, and said compressor block against said TAB section, with a first force, and
    ii) using a second biasing means for pressing said compressor block against said semiconductor chip with a second force that is less than said first force; and
  b) after performing step (a), heating said TAB semiconductor package at a sufficient temperature and duration for flowing a portion of said adhesive out from between said TAB section and said first surface of said housing to envelope an inner portion of the outer leads in adhesive, thereby causing said adhesive to maintain alignment and electrical isolation of said outer leads.

9. The method in accordance with claim 8, wherein said second biasing means using step includes the step of biasing a plunger disposed within said compressor block to push said semiconductor chip against a chip adhesive on said housing member when said first biasing means presses said compressor bar against said compressor block, whereby said chip adhesive is dispersed over said semiconductor chip.

* * * * *